US008635055B1

(12) United States Patent
Wey et al.

(10) Patent No.: US 8,635,055 B1
(45) Date of Patent: Jan. 21, 2014

(54) COMPOSITE SIGNAL CONFIGURATION ELEMENT FOR MODELING ENVIRONMENTS

(75) Inventors: Claudia Wey, Wayland, MA (US); Krishna Balasubramanin, West Roxbury, MA (US)

(73) Assignee: The Math Works, Inc., Natick, MA (US)

( * ) Notice: Subject to any disclaimer, the term of this patent is extended or adjusted under 35 U.S.C. 154(b) by 973 days.

(21) Appl. No.: 11/975,078

(22) Filed: Oct. 16, 2007

Related U.S. Application Data

(60) Provisional application No. 60/852,300, filed on Oct. 16, 2006.

(51) Int. Cl.
*G06G 7/62* (2006.01)
*G06F 17/50* (2006.01)
(52) U.S. Cl.
USPC .......................................................... 703/13

(58) Field of Classification Search
USPC ........................................................ 703/13
See application file for complete search history.

(56) References Cited

PUBLICATIONS

The Mathworks, Inc., "Using Simulink Version 6", Sep. 2005, 711 pages.*

* cited by examiner

*Primary Examiner* — S Lo
(74) *Attorney, Agent, or Firm* — Nelson Mullins Riley & Scarborough LLP

(57) ABSTRACT

In a modeling environment, a composite signal configuration element is provided. The composite signal configuration element configures one or more signals of a composite signal having a selectable grouping of the one or more signals. Configuring signals of a composite signal allows for the selectable creation, editing, and separation of composite signals. In some embodiments, hierarchical composite signals may be selectably created edited or separated into individual signals. In certain embodiments the composite signal configuration element may include additional functionality for performing operation on the composite signal.

24 Claims, 17 Drawing Sheets

COMPOSITE SIGNAL CONFIGURATION ELEMENT FOR MODELING ENVIRONMENTS

RELATED APPLICATION

The instant application claims the benefit of provisional patent application No. 60/852,300 filed Oct. 16, 2006, the contents of which are incorporated herein by reference in their entirety.

BACKGROUND

Graphical modeling environments allow users to build graphical models. Graphical models may contain graphical components that are interconnected by connections. The graphical components may be units of functionality. The connections may represent, for example, data flow, signal paths, power connections, state transitions, function calls, or simply connectors.

In many models the connections between components are represented by signals. In models that contain signals, users may desire to group signals together to facilitate user interactions with the models. Models may be configured to treat bundled signals as composite signals that include the signals making up the bundle.

SUMMARY

In a modeling environment, a composite signal configuration element may be provided. The composite signal configuration element may configure one or more signals of a composite signal. Configuring signals of a composite signal using the composite signal configuration element may allow for the creation, editing, mapping, and separation of composite signals including hierarchical and concatenated composite signals. The composite signal configuration element may also allow for type specification and type checking.

In accordance with one embodiment, a medium holding executable instructions is provided for use with a computing device. The instructions include one or more instructions for obtaining a composite signal configuration element. There are also one or more instructions for receiving, at the composite signal configuration element, a first plurality of individual signals. Other instructions are for configuring, using the composite signal configuration element, one or more of the first plurality of individual signals. Still other instructions are for outputting, from the composite signal configuration element, at least one of the configured signals. Finally, there are one or more instructions for displaying, storing, or transferring the at least one of the configured signals.

In accordance with another embodiment, a medium holding instructions executable by a computing device is provided. The instructions include one or more instructions for obtaining a composite signal configuration element. There are also one or more instructions for receiving, at the composite signal configuration element, a first plurality of signals. Other instructions are for configuring, using the composite signal configuration element, one or more of the first plurality of signals. Still other instructions are for outputting, from the composite signal configuration element, at least one composite signal comprising one or more of the configured signals, wherein the composite signal comprises a selectable subset of the first plurality of signals. Finally, there are one or more instructions for displaying, storing, or transferring the composite signal.

In accordance with another embodiment, a medium holding instructions executable by a computing device is provided. The instructions include instructions for obtaining a composite signal configuration element for configuring one or more signals of a composite signal. There are also instructions for configuring one or more signals of a composite signal using the composite signal configuration element. Other instructions are for displaying, storing, or transferring a result of configuring one or more signals of the composite signal. Finally, there are instructions for generating code from the configuration of the one or more signals, wherein the generated code comprises a cast operator.

In accordance with another embodiment, a computing device is provided for generating and displaying a modeling application. The computing device includes user-operable input means for inputting data to the modeling application, a display device for displaying a model, memory for storing computer program instructions and data, a processor for executing the stored computer program instructions. The processor, in executing the stored computer program instructions, uses a composite signal configuration element to configure one or more individual signals; to output from the composite signal configuration element, at least one of the configured signals; and to display, store, or transfer the at least one configured signal.

In accordance with another embodiment, a computing device is provided for generating and displaying a modeling application. The computing device includes user-operable input means for inputting data to the modeling application, a display device for displaying a model, memory for storing computer program instructions and data, a processor for executing the stored computer program instructions. The processor, in executing the instructions, uses a composite signal configuration element to configure one or more of a first plurality of signals; to output from the composite signal configuration element at least one composite signal comprising a selectable subset of the first plurality of signals and including one or more of the configured signals; and to display, store, or transfer the composite signal.

DETAILED DESCRIPTION

Figure 1A:
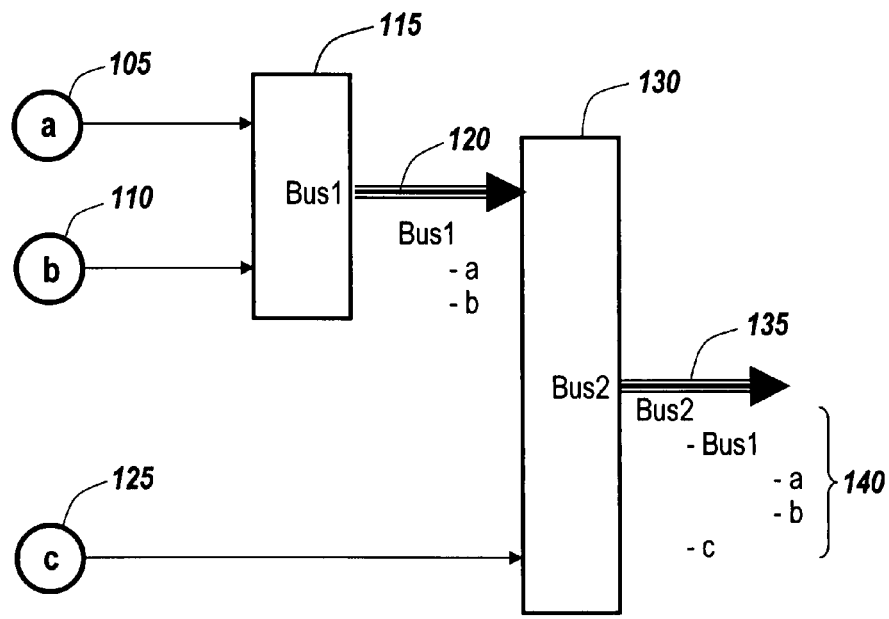
FIG. 1A illustrates a conventional block diagram system for handling bundled signals.

One current method of grouping signals is to use a bus creator to create a bus signal. The bus signal is a composite signal that contains the grouped signals. This method, however, may be overly rigid, inefficient, tedious and/or difficult, especially when dealing with a large number of signals.

Bus creators create a non-selectable, structured grouping of signals. In order to affect a hierarchy with a bus creator, subgroups are bundled using the bus creators, and the resulting subgroup bus signals are grouped using additional bus creators. When the number of signals is in the hundreds, creating such a hierarchy, with a bus creator for each level of the hierarchy, is onerous and/or time-consuming.

Another drawback of the non-selectable, structured grouping of signals provided by bus creators is that the input to output mapping is fixed and limited in such bus creators. That is, all the input signals received by a bus creator are combined into one bus. Thus, in order to create multiple buses containing different combinations of signals, multiple bus creators need to be used.

The exemplary embodiments described herein may eliminate the above described problems associated with using bus creators by using composite signal configuration elements. The composite signal configuration elements may provide a user with the ability to selectively create, edit, separate, and/or specify composite signals. The composite signal configuration element may selectively group, concatenate, specify, organize into a hierarchy, edit, and/or ungroup one or more signals to conform to a user configuration.

The use of composite signal configuration elements simplifies the modeling of systems by providing a flexible, versatile technique for handling composite signals. Once a configuration is selected or otherwise specified for signals using the component signal configuration element, the configuration may be saved as a template to be used again. Templates let a user specify a desired configuration once and then use the template composite signal configuration block in multiple instances without the need to fully specify each instance separately.

The use of composite signal configuration elements also assists in collaborative design techniques. For example, in a top-down design approach, the use of composite signal configuration elements allows for flexibility to the input and output requirements for interconnected elements. Using composite signal configuration elements, inputs and outputs can be dynamically specified and configured as needed without causing inoperability between subsystems.

As used herein the term "signal" refers to the means by which data is passed between elements in a model. A signal may refer to a channel, a state transition, a function call, or a physical connection between elements. The term "composite signal" refers to signals that include a group of combined, nested, bundled, or tie-wrapped signals. Examples of composite signals include, but are not limited to, a bus, a bus signal, a bus object, bundled signals, and tie-wrapped signals.

In certain embodiments, identifying information associated with a composite signal identifies a format for data making up the composite signal. The use of associated identifying information allows universal handling of the signal throughout a system. The use of identifying information allows an element operating on the signal to identify the data present in a composite signal as well as the format of the data. The identifying information may include the number of signals that make up the composite signal. The identifying information may include the name or other identifier of the composite signal as well as the names or their identifiers of the signals that make up the composite signal. With this information the composite signal can be decomposed into its composites and reconstituted back into a composite signal.

The composite signal configuration element allows for the signals of a composite signal to have selectable groupings, such as hierarchical or concatenated groupings. The configuration of one or more signals of a composite signal allows for the selectable mapping of a first received group of signals in any format (individual, composite, or any combination thereof) to a second group of signals outputted in any format (individual, composite, or combination thereof). This includes the ability to create, separate, or rearrange hierarchical composite signals. Thus, a composite signal configuration element may be used to replace a bus creator, a bus selector, or a combination thereof. The signals can be selectively concatenated, arranged in a hierarchy, or grouped to created vectors of composite signals. Additional examples of the provided configurability and the problems overcome by such configurability can be seen in FIGS. 1A-B, 2A-B, 3A-B, and 4A-C.

FIG. 1A depicts a conventional bus creator having a non-selectable structured grouping that may not allow a signal to be added or concatenated to a composite signal without creating a hierarchy in the composite signal. In this example, signal "c" 125 is added to composite signal "Bus 1" 120. Signal "Bus 1" 120 consists of signals "a" 105 and "b" 110 created using a traditional bus creator 115. To add signal "c" 125 to Signal "Bus 1" 120 a second bus creator 130 is used. The resulting signal 135 may have a hierarchical structure 140 due to the two staged bus creators 115 and 130 that are used to create composite signal 135. The limitation of this is that in some instances, a user may just wish to add signal "c" 125 to composite signal "Bus 1" 120 without creating such a hierarchy.

Figure 1B:
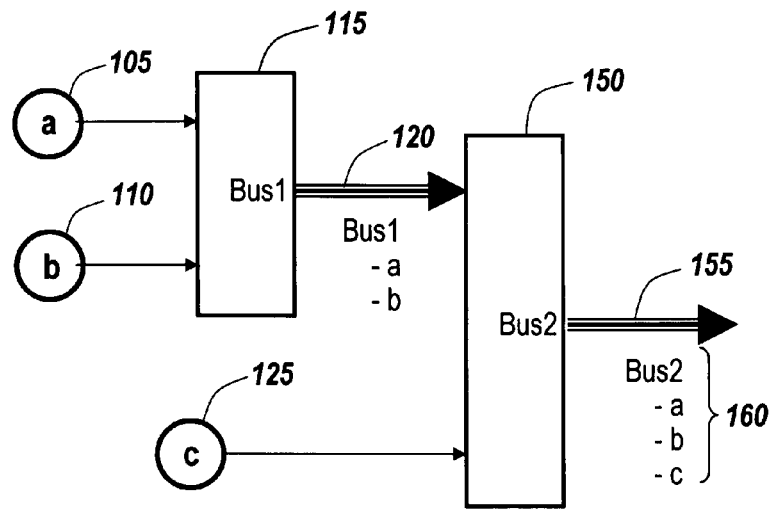
FIG. 1B illustrates a block diagram that employs a composite signal configuration element to accommodate bundled signals.

FIG. 1B depicts how a composite signal configuration element 150 used with an exemplary embodiment can provide the ability to concatenate a signal without creating hierarchical structure for an example case that corresponds to the arrangement shown in FIG. 1A. In this example, the composite signal configuration element 150 is a block that can be used to replace the second bus creator 130 of FIG. 1A. Because the composite signal configuration element 150 allows for the selectable grouping of one or more of the signals of a composite signal, the composite signal 155 output from composite signal configuration element 150 can include signals "a", "b", and "c" but have a structure 160 that is not hierarchical.

Figure 2A:
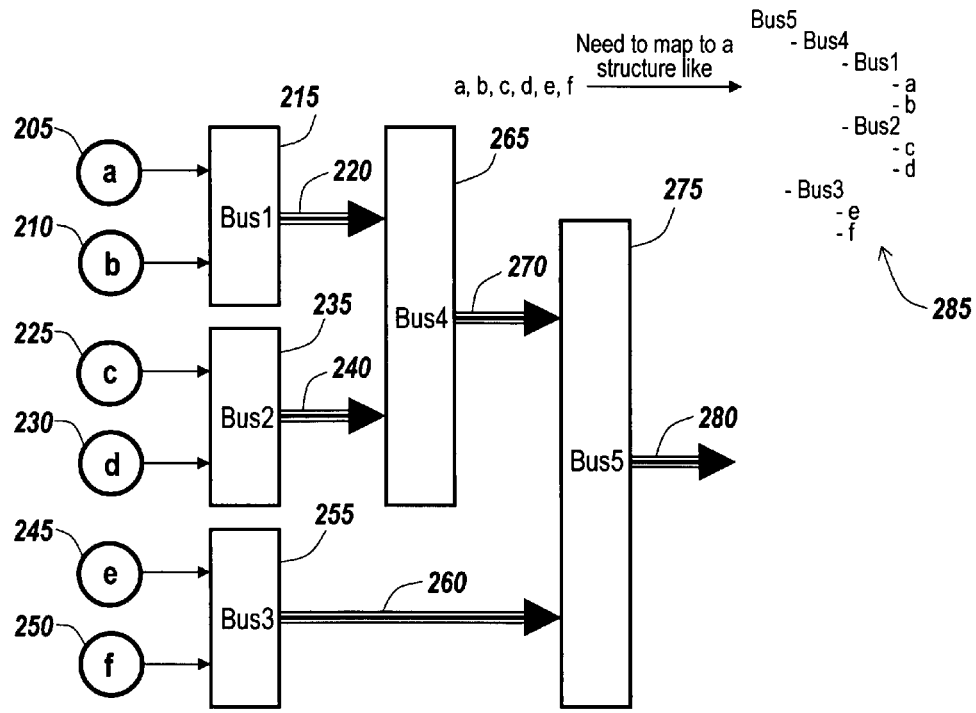
FIG. 2A illustrates another conventional block diagram system for handling bundled signals.
Figure 2B:
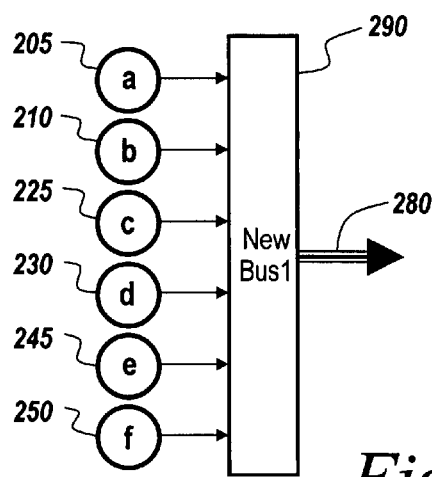
FIG. 2B illustrates a block diagram that employs a composite signal configuration element to accommodate bundled signals.

Conversely, if a user wishes to create a hierarchical structure, the composite signal configuration element 150 can be used to configure such a structure. FIG. 2A depicts a conventional configuration that may be used to create a hierarchical structure using conventional bus creators. In this example, signals "a" 205 and "b" 210 are combined by bus creator 215 into composite signal 220, signals "c" 225 and "d" 230 are combined by bus creator 235 into composite signal 240, and signals "e" 245 and "f" 250 are combined by bus creator 255 into composite signal 260. Composite signals 220 and 240 are combined by bus creator 265 into composite signal 270. Composite signals 260 and 270 are combined by bus creator 275 into composite signal 280 having a hierarchical structure 285 as shown.

The configurable nature of the composite configuration element 290 enables one element to replace all the bus creators of FIG. 2A. An example of this can be seen in FIG. 2B. Here, signals "a" through "f" 205, 210, 225, 230, 245, and 250 are combined into a composite signal 280 using composite signal configuration element 290 wherein the composite signal 280 has the desired hierarchical structure 285.

A composite signal configuration element may also be used to create multiple composite signals. In conventional systems, creating multiple composite signals may have required that each composite signal had to be created individually. An example of this can be seen in FIG. 3A. Here signals "a" 305 and "b" 310 are combined by bus creator 315 into composite signal 320, signals "c" 325 and "d" 330 are combined by bus creator 335 into composite signal 340, signals "e" 345 and "f" 350 are combined by bus creator 355 into composite signal 360, and signals "g" 365 and "h" 370 are combined by bus creator 375 into composite signal 380. Buses 320 and 340 are combined by bus creator 385 into composite signal 390. Buses 360 and 380 are combined by bus creator 395 into composite signal 400. Composite signals 390 and 400 have a hierarchical structure 405.

Figure 3A:
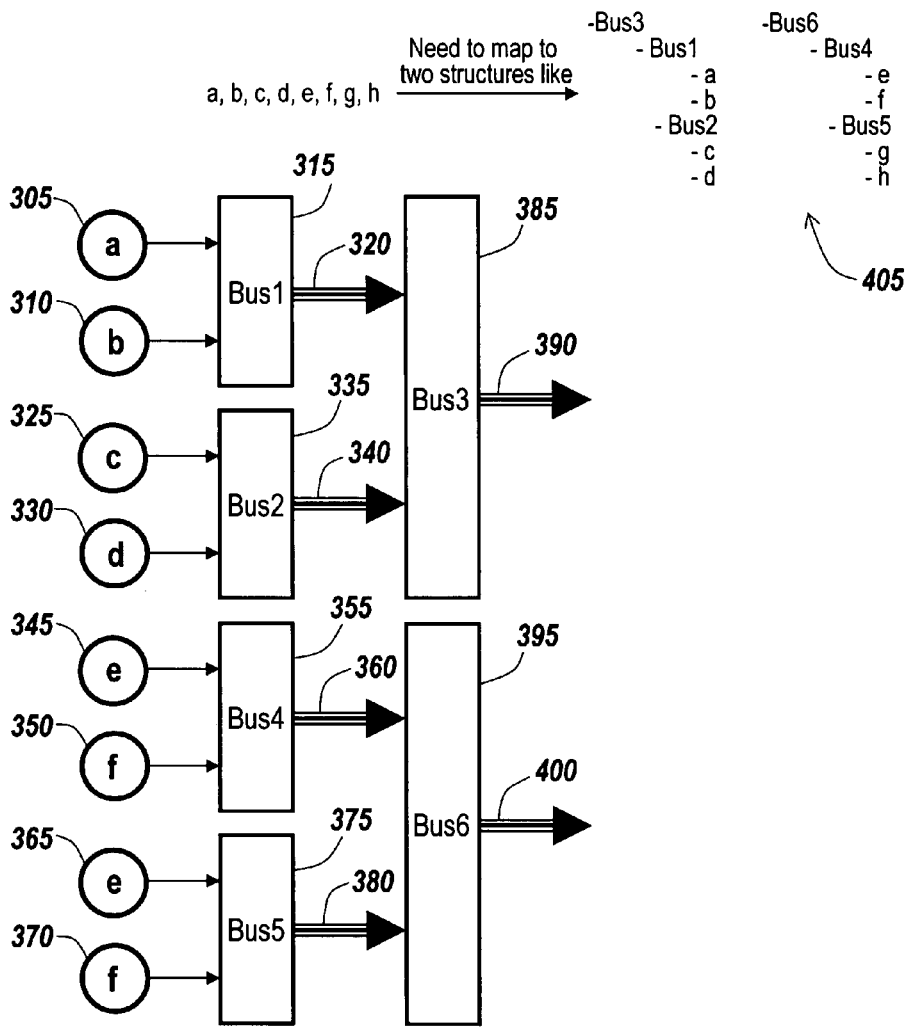
FIG. 3A illustrates another conventional block diagram system for handling bundled signals.
Figure 3B:
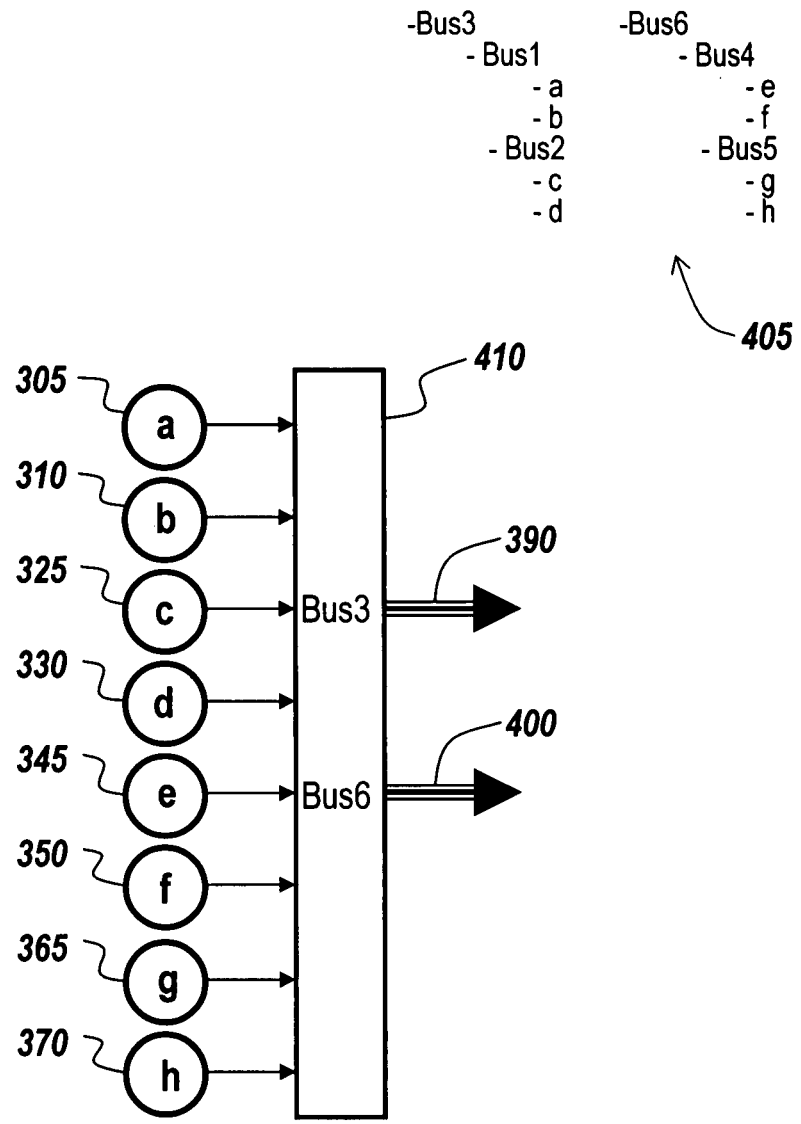
FIG. 3B illustrates a block diagram that employs a composite signal configuration element to accommodate bundled signals.

FIG. 3B depicts a composite signal configuration element 410 which can replace some or all of the bus creators of a conventional configuration, such as the configuration illustrated in FIG. 3A. Signals "a" through "h" 305, 310, 325, 330, 345, 350, 365 and 370 are combined into composite signals 390 and 400 using composite signal configuration element 410 wherein the grouping of signals is selectable allowing the composite signals 390 and 400 to have the desired hierarchical structure 405.

Figure 4A:
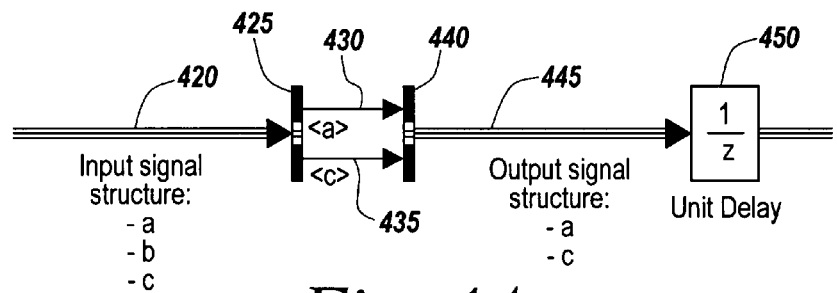
FIGS. 4A-B illustrates conventional block diagrams system for handling bundled signals.
Figure 4B:
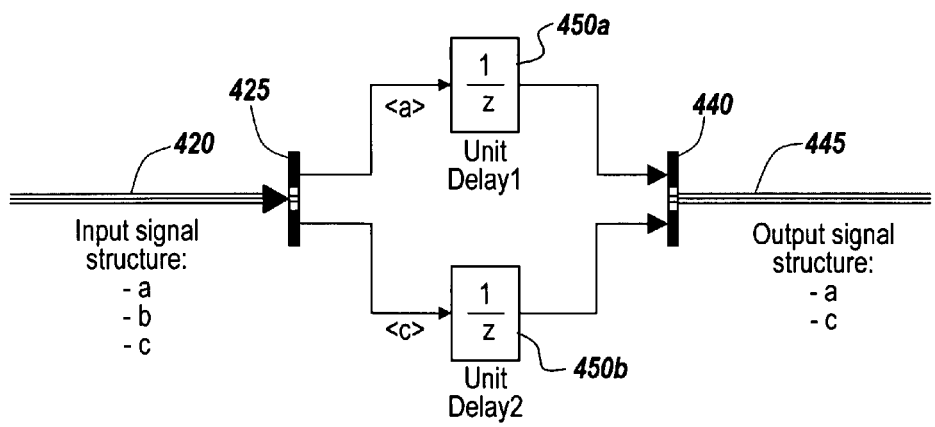

In certain instances, a user may wish to isolate certain individual signals of a composite signal in order to perform an operation on the individual signals. FIGS. 4A and 4B depict some examples of how this may have been accomplished using conventional techniques.

FIG. 4A depicts one conventional technique of isolating signals "a" 430 and "c" 435 from a composite signal 420 that groups signals "a", "b", and "c". In this example a bus selector 425 is used to select signals "a" 430 and "c" 435. Bus creator 440 combines the signals "a" 430 and "c" 435 into composite signal 445 which is input into delay 450 to delay signals "a" and "c".

FIG. 4B depicts an alternate conventional technique for adding a delay to signals "a" and "c". Signals "a" 430 and "c" 435 are selected from composite signal 420 using bus selector 425 and are individually passed to delays 450a and 450b before being recombined by bus creator 440 into composite signal 445.

Figure 4C:
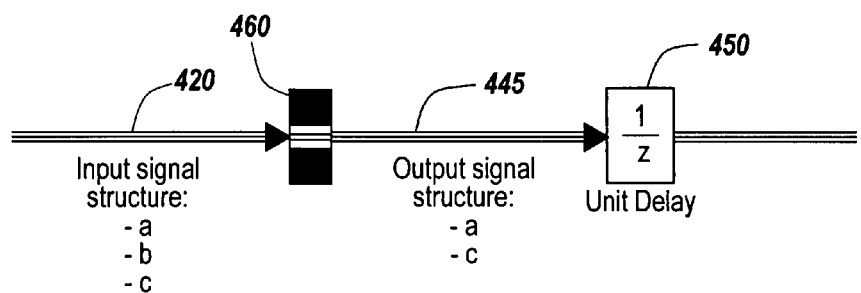
FIG. 4C illustrates a block diagram that employs a composite signal configuration element to accommodate bundled signals.

FIG. 4C depicts a composite signal configuration element 460 that can be used with an exemplary embodiment to replace the bus selector 425 and bus creator 440 of FIGS. 4A and 4B. The composite signal configuration element 460 receives composite signal 420, that groups signals "a", "b", and "c", and outputs composite signal 445, which groups signal "a" and signal "c". Thus composite signal 445 includes a selectable subset of the individual signals "a", "b", and "c" provide in composite signal 420. Composite signal 445 is passed to delay 450 to delay signals "a" and "c".

Thus, it can be seen that the use of the disclosed composite signal configuration element reduces the number of elements needed. This provides significant savings in both the user's time and system resources needed to model a system.

In further embodiments, signals, both individual and composite, of varying directionality may also be configured. For example, a composite signal having one-directional signals of different directions may be created or otherwise configured. The composite signal may have a one-directional signal such as a "send" signal and a one-directional signal, having opposite directionality, such as a "receive" signal. Bi-directional signals may also be used and configured in a similar fashion. Other possible configurations and combinations will be apparent given the benefit of this disclosure.

In some embodiments, configuring one or more signals may also include specifying attributes for the one or more signals. This may include naming or renaming individual signals and composite signals. This may also include defining attributes such as data type (or storage format), complexity, dimensionality, and directionality for individual signals and composite signals. In embodiments where the composite signal has associated identifying information, this information may also be specified. An example of this can be seen in FIG. 5.

Figure 5:
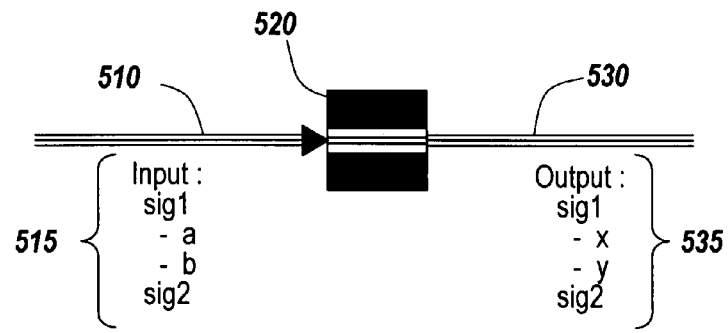
FIG. 5 illustrates one embodiment of a composite signal configuration element.

FIG. 5 depicts the use of a composite signal configuration element in renaming one or more signals of a composite signal. In this example, a composite signal 510 having a hierarchical structure 515 is input into composite configuration element 520 which outputs a composite signal having a hierarchical structure 535. While the structure of the composite signal is not changed, the names of the signals that make up the composite signal are modified. Signal "a" is renamed signal "x," and signal "b" is renamed signal "y". In code, this would performed by a cast operator.

Figure 6:
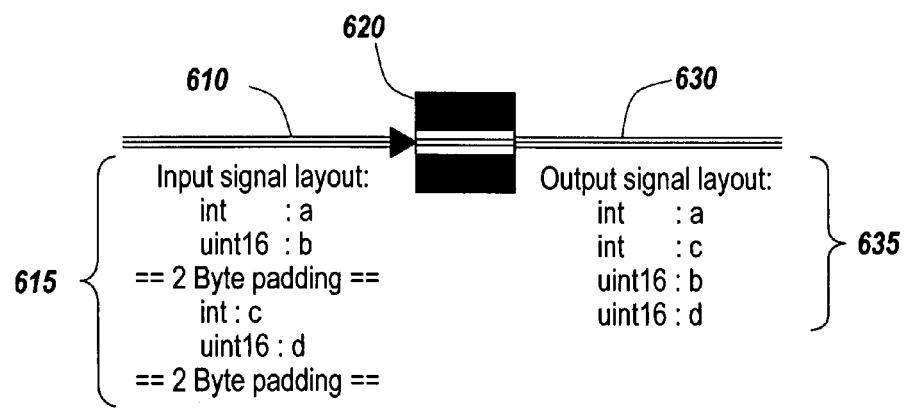
FIG. 6 illustrates another embodiment of a composite signal configuration element.

Specifying attributes may also include specifying structural attributes. For example, in certain embodiments, composite signals are realized as C structures in generated code. As part of such structures there may be bytes of "padding" between signals. In the example of FIG. 6, the input composite signal 610 has a structure 615 that uses 4 bytes of padding. By manipulating the structure using a composite signal configuration block 620, a user can eliminate the need for the padding in the structure 635 of the output composite signal 630. This results in smaller code and/or more efficient resource usage. Likewise, memory usage can be made more efficient by having the data of the group of signals of the composite signal be written to consecutive memory locations allowing for faster and more efficient read and write cycles during execution.

In some embodiments, the configuration may be specified by a user. In some embodiments this may be achieved using a textual means such as from a command line interface or by executing a script. In other embodiments this may be achieved via a Graphical User Interface (GUI). An example of such a system can be seen in FIG. 7.

Figure 7:
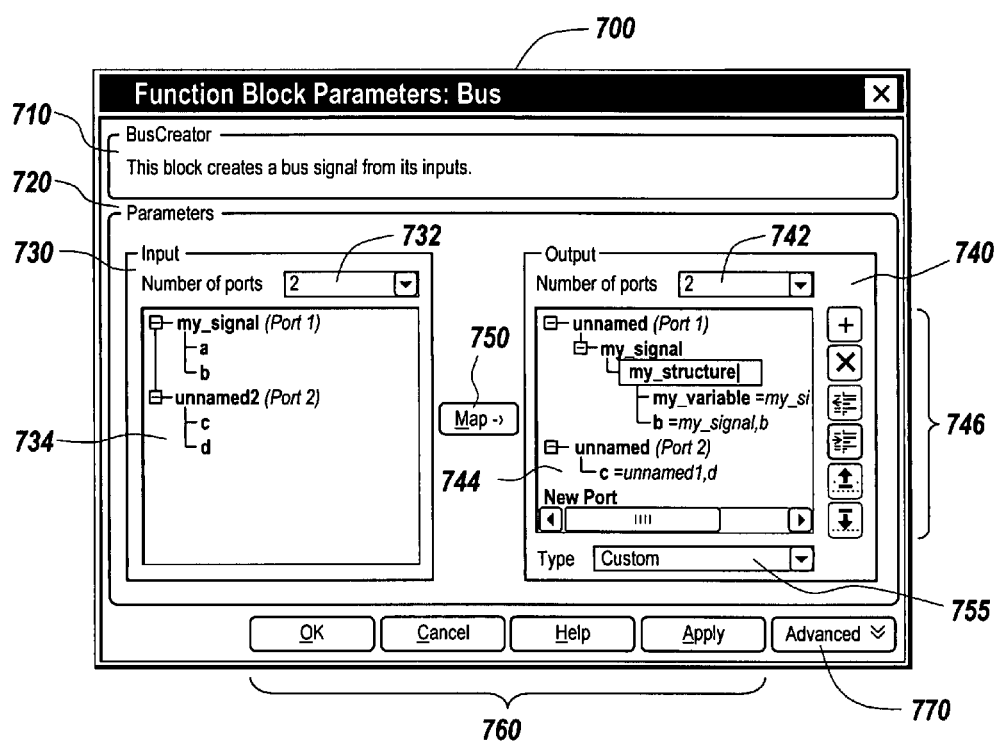
FIGS. 7 and 8 illustrate a graphical user interface for specifying the configuration of one or more signals of a composite signal.

FIG. 7 depicts an illustrative example of a GUI for a composite signal configuration element. This GUI may be accessed by a menu, or right clicking a selected element such as a block, port, or composite signal of interest. In this example, a configuration box 700 is provided allowing the user to configure one or more signals of a composite signal. Field 710 contains text that describes the functionality of the block. In this example, the composite signal configuration element is functioning like a bus creator wherein the block creates a composite signal (referred to as a bus) from its inputs. Field 720 defines the parameters of the composite signal configuration element. Within field 720 are two sub-fields 730 and 740 regarding the input and output of the block, respectively.

In input field 730, there is a combo box 732 where the number of input ports may be specified. The number of ports may be preconfigured or automatically configured, or may be selected from a pull-down menu, directly entered by a user, or otherwise specified. In the present example the number of ports has been set to two. Below combo box 732 is area pane 734 where information regarding the inputs received is displayed. In this example two inputs are being received. On Port 1 the input is a composite signal designated "my_signal" containing a signal "a" and a signal "b". On Port 2 the input is a composite signal designated "unnamed2" containing a signal "c" and a signal "d".

In output field 740 there is a combo box 742 where the number of output ports may be specified. The number of ports may be preconfigured or automatically configured, or may be selected from a pull-down menu, directly entered by a user, or otherwise specified. In the present example the number of ports has been set to two. Below combo box 742 is a pane 744 where information regarding the outputs is displayed. In this example the received signals have been configured into two outputs. On Port 1 is a composite signal designated "my_signal" which has been configured to include a composite signal designated "my-structure" comprising signal "my variable" and signal "b". On Port 2 is signal "c". As can be seen in this example, the configuration of the signals can be specified and edited by a user. For example, signals or composite signals can be renamed by editing the designation. Signals may also be added, deleted, or arranged in hierarchy, for example, by using editing commands from a pull down menu or provided buttons 746.

In the embodiment of the example of FIG. 7, the configuration box is further provided with auto-mapping functionality. By selecting the button 750 entitled "Map" the functionality of the block maps the signals received on the input ports to the output ports. The configuration of the signals on the output ports may be directed by previously specified configuration files. The Type field 755 allows the user to specify the desired configuration. In the present example, the type has been specified as custom wherein the user manually specifies the configuration. Once a configuration has been specified, the configuration may then be saved as a type. The use of types allows for template composite signal configuration elements that can be used in repeated instances without requiring the configuration to be specified at each instance.

In the example of FIG. 7, command buttons 760 are also provided to allow the user to access certain commonly used menu command while using the configuration box 700. An advanced button 770 is also provided giving the user greater control over the configuration of the block. An example of this can be seen in FIG. 8.

Figure 8:
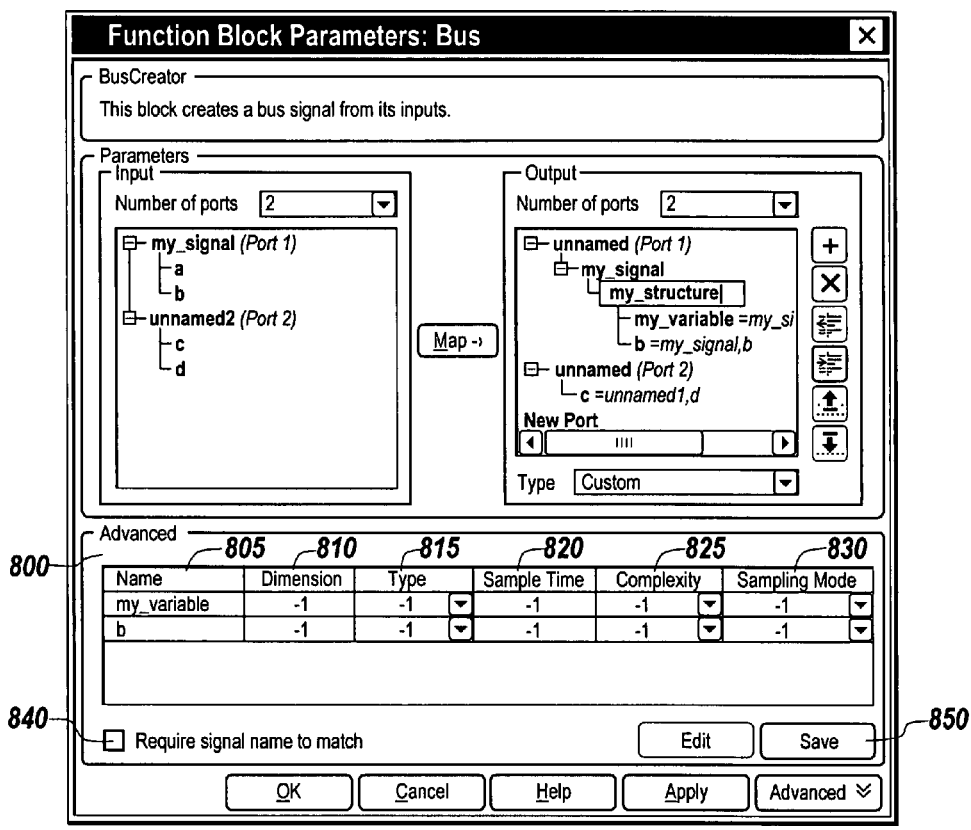

FIG. 8 is the graphical user interface of FIG. 7 in which the advanced button has been selected. In this embodiment an advanced field 800 is provided which allows the user to specify various attributes of one or more signal of the output composite signal being edited on port 1. In this example, the attributes include Name 805, Dimensionality 810, Type 815, Sample Time 820, Complexity 825, and Sampling Mode 830. Once a user is satisfied with the specified attributes, the user may then elect to save the specified attributes using the save button 850. In certain embodiments, a user may also be allowed to select whether signal name matching be required 840.

In certain embodiments, configurations such as mappings or attributes may be set or "locked in" wherein signals received or output by a configuration block must comply with the "locked in" configuration. This allows for format or type enforcement in modeled systems. An example of this can be seen in FIG. 9.

Figure 9:
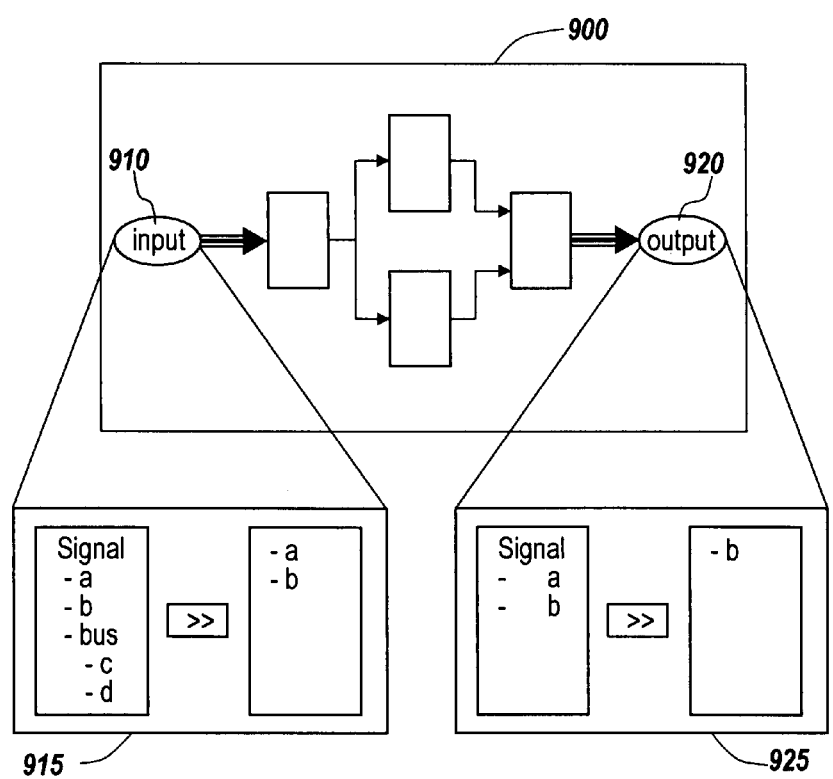
FIG. 9 illustrates an embodiment wherein the configuration of a component signal is specified for an input and output of a block diagram.

FIG. 9 depicts a block diagram 900 of a model wherein the input 910 is specified 915 so that only selected signals "a" and "b" of the received signal are received by the model. The output 920 is also specified so that only signal "b" is passed from the output.

The ability to set or enforce configuration of signals may be user specified and include the ability to specify the level of enforcement. This is beneficial in modeling workflow wherein an initial rough draft may require greater flexibility for signal format or type but as the model design is formalized, the configuration of signals received or outputted require greater specification and enforcement. An example of specifying an input using a GUI can be seen in FIGS. 10A-C.

Figure 10A:
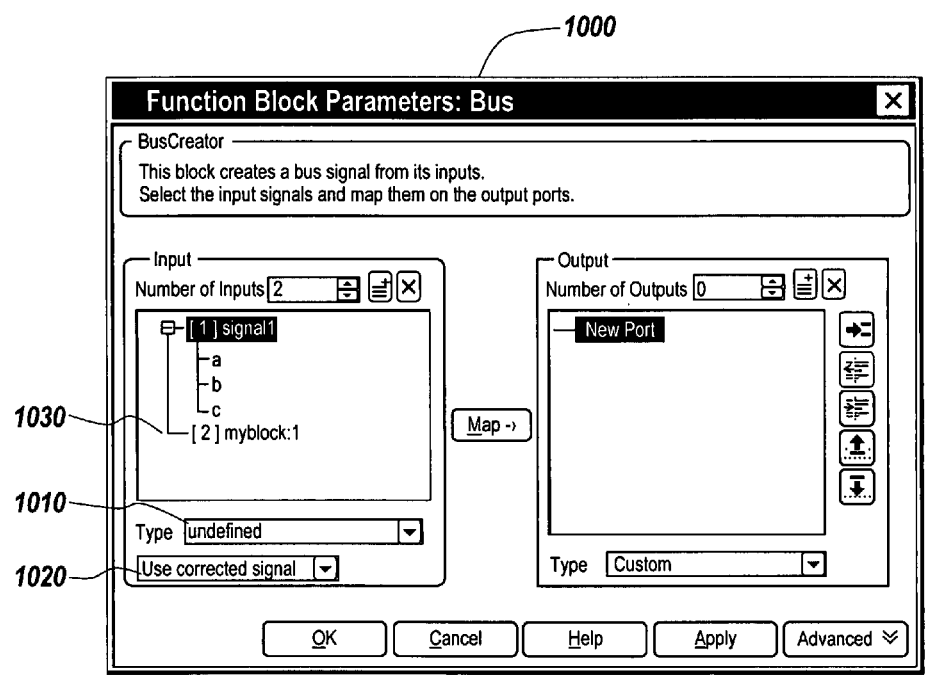
FIGS. 10A and 10B illustrate a graphical user interface for specifying the input configuration of one or more signals of a composite signal.
Figure 10B:
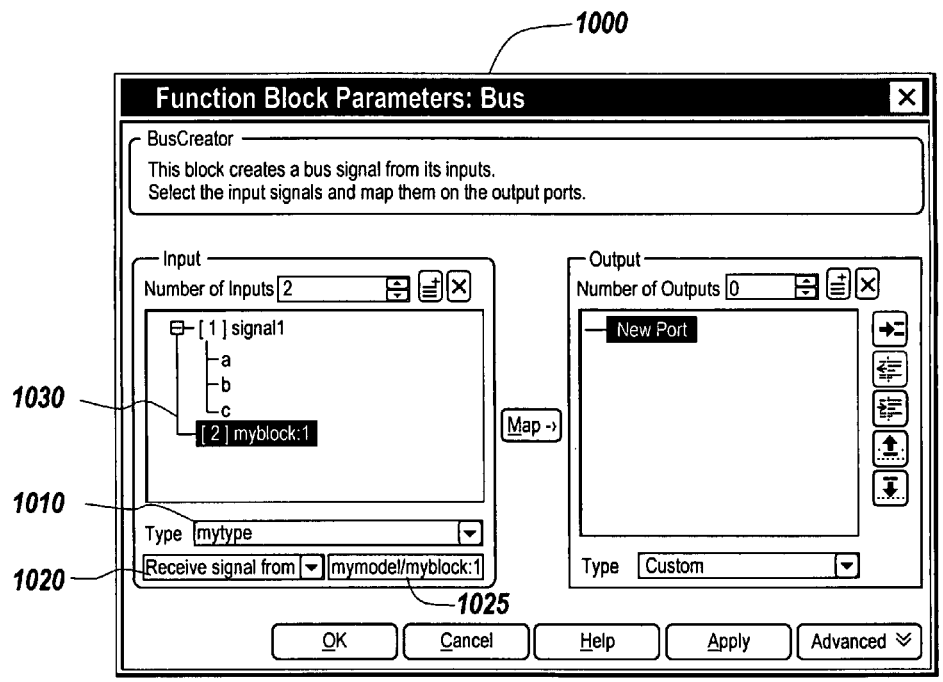

FIGS. 10A and 10B depict an example of GUI 1000 as shown in FIGS. 7 and 8 wherein the GUI 1000 is used to specify an input. In the example of FIG. 10A, the input on port 1 of the composite signal configuration block is configured using the GUI 1000. The input type is left undefined as indicated by type field 1010. In certain embodiments, the source for the input may also be specified. In the example of FIG. 10A, the source for the input is specified as the signal connected to port 1 of the composite signal configuration element as indicated by input source field 1020. In this example the input is connected composite signal "signal1" which consists of signals "a", "b", and "c" as indicated in the input field 1030.

In the example of FIG. 10B the input on port 2 of the composite signal configuration block is configured using the GUI 1000. Here, the input type is specified as "mytype" as indicated by type field 1010. In the example of FIG. 10B the source for the input is specified as the signal received from a designated source as indicated by input source field 1020. The source is specified as the element with index 1 of "mymodel/myblock" in field 1025.

In cases where the source for an input has been specified without the source being connected as depicted in FIG. 10B, the graphical representation of the signal configuration element in the graphical modeling environment may indicate the source specification. An example of this can be seen in FIG. 10C.

Figure 10C:
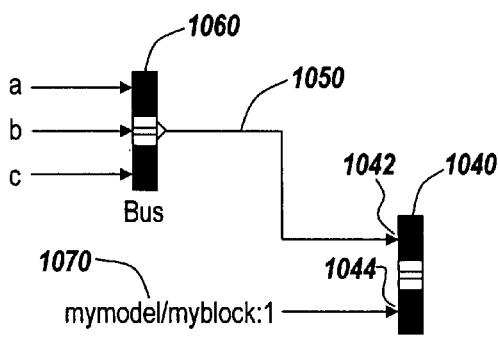
FIG. 10C illustrates an exemplary block diagram wherein the source for a signal is graphically indicated.

FIG. 10C depicts a block diagram representation of the composite signal configuration element 1040 being configured using the GUI 1000 of FIGS. 10A and 10B. As shown here, a composite signal 1050 from composite signal configuration element 1060 is connected to port 1 (1042) of component signal configuration element 1040. This is the composite signal 1050 identified as "signal1" in FIGS. 10A and 10B. In FIG. 10B port 2 (1044) of composite signal configuration element 1040 has its source specified as "mymodel/myblock." In FIG. 10C this is graphically indicated by a source tag 1070 indicating that signal provided to port 2 (1544) of composite signal configuration block 1040 is received from "mymodel/myblock"

It should be understood that the output ports likewise may be specified, including input type and source type. Configuration of output ports may be performed using a GUI as shown in FIGS. 10A and 10B. In other embodiments configuration may be performed using textual means such as a command line interface or by executing a script In some embodiments a composite signal configuration element may include additional functionality for performing an operation on one or more of the signals of a composite signal. Likewise, the functionality of a composite signal element may be incorporated into another element. By providing such functionality, one or more signals can be separated or combined together before a desired operation is performed on the signals. For example, and import block may include such configuration functionality so that the output of the import block has a desired format or configuration. Another example can be seen in FIG. 11A and FIG. 11B.

Figure 11A:
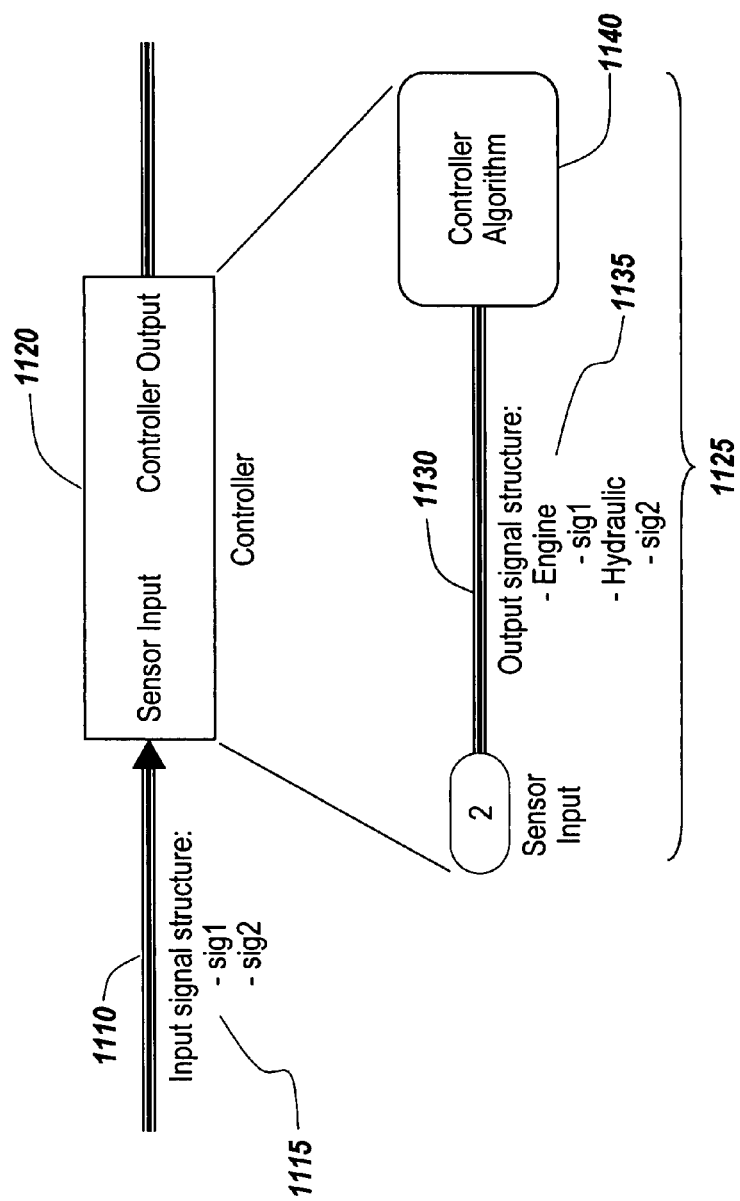
FIG. 11A illustrates an exemplary block diagram containing a block that includes composite signal configuration functionality.

In the example of FIG. 11A, component signal configuration functionality is provided as part of controller block 1120. The controller block 1120 receives a composite signal 1110 having a certain structure 1115. The internal functionality 1125 of the controller block 1120 includes composite signal configuration functionality that specifies that the received composite signal 1110 be mapped to composite signal 1130 having a desired structure 1135 before being passed to the controller algorithm 1140. By being able to incorporate component signal configuration functionality with other functionality in the same element, many modeling techniques become more robust and useful. An example of such a modeling technique is top-down design.

Top-down design is a modeling technique that can be used to create large, architecturally complex models. In top-down design, the user(s) conduct requirements gathering and create a functional specification of the system to be modeled. Using the functional specification, an architectural view of the system can be created. An example of such an architectural view can be seen in FIG. 11B.

Figure 11B:
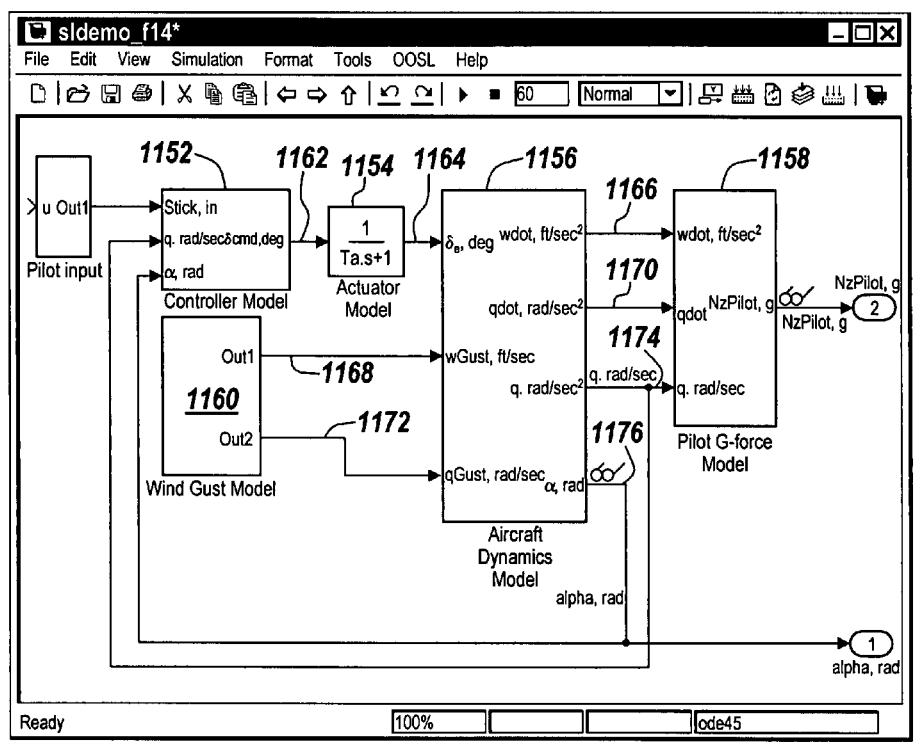
FIG. 11B illustrates an exemplary block diagram designed using a Top-down design technique.

In the example of FIG. 11B, each subsystem 1152, 1154, 1156, 1158, and 1160 of the larger system 1150 represents a self contained entity that contains a specific functionality. The subsystems 1152, 1154, 1156, 1158, and 1160 communicate with each other via the interconnecting signals 1162, 1164, 1166, 1168, 1170, 1172, 1174, and 1176. The requirements for these signals 1162, 1164, 1166, 1168, 1170, 1172, 1174, and 1176 that are accepted and produced by subsystems 1152, 1154, 1156, 1158, and 1160 constitute the interfaces defined in functional specification for the system 1150. Traditionally, the interfaces at the boundaries of the different subsystems are specified using bus objects. Thus, the bus signals and their components are specified. Once the boundaries are specified, the system may be partitioned into subsystems and implemented in parallel by development teams. This approach can be very effective in that it allows parallel and iterative development. However, the traditional approach in which the interfaces are specified using bus objects can introduce difficulties.

One such problem is that changes to the bus structure at the interfaces can break the model. For example, if subsystem 1152 produces a bus structure that is different from what subsystem 1154 is supposed to receive, the model may not compile correctly or at all. It may further be difficult to determine which signals are needed and/or what signals are not used in a given subsystem and this may change in every subsystem. As such, any change to a signal or bus signal structure can affect the system downstream.

By using component signal configuration functionality as seen in FIGS. 9 and 10A-C, the top-down design technique no longer suffers from such limitations. Rigid enforcement may be implemented as seen in FIG. 9 or varying levels of specification may be implemented as seen in FIGS. 10A through 10B. Likewise, required signals not passed to a subsystem may be provided using the component signal configuration functionality as seen in FIG. 10C. Thus the input and output for a subsystem can be dynamically specified as needed by providing component signal configuration functionally in conjunction with the specific functionality of a given subsystem.

Figure 12A:
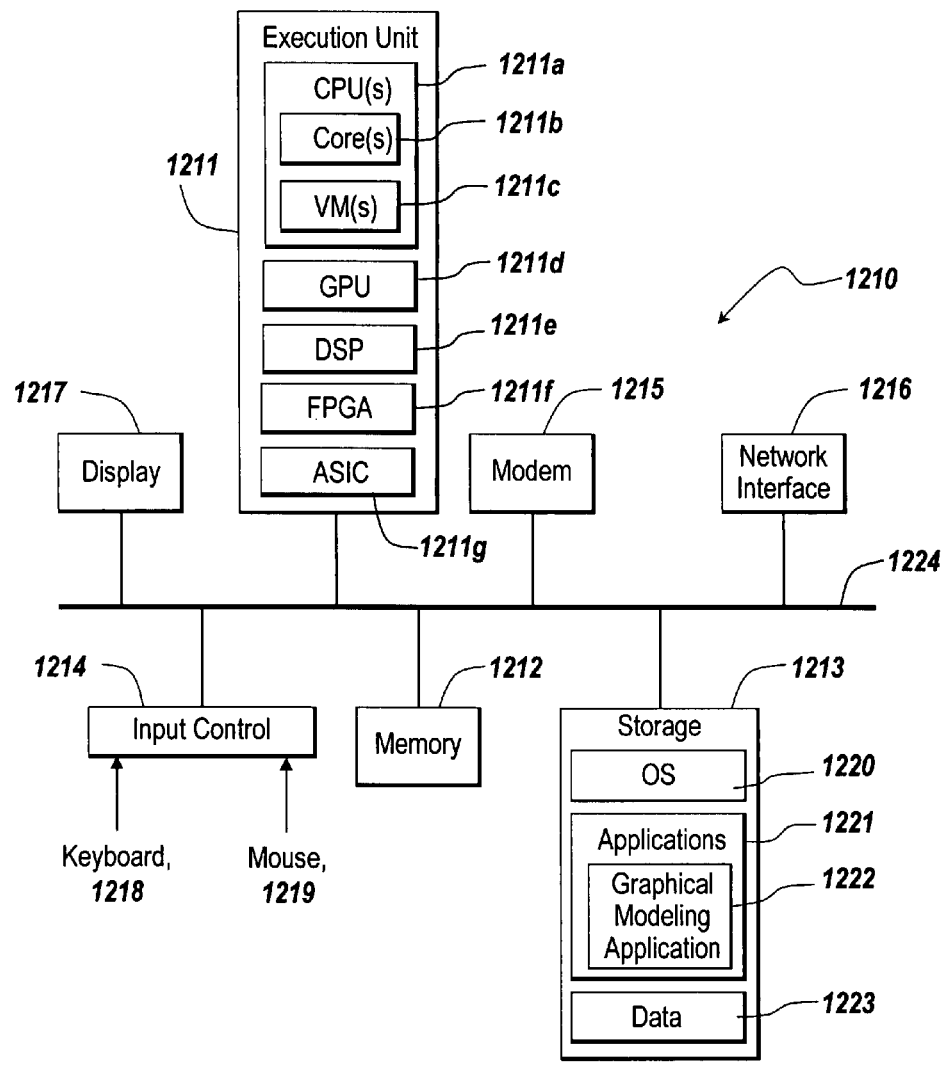
FIG. 12A illustrates an environment suitable for practicing an exemplary embodiment.

FIG. 12A is an exemplary computing device 1210 suitable for practicing an exemplary embodiment. One of ordinary skill in the art will appreciate that the computing device 1210 is intended to be illustrative and not limiting of the present invention. The computing device 1210 may take many forms, including but not limited to a workstation, server, network computer, quantum computer, optical computer, bio computer, Internet appliance, mobile device, pager, tablet computer, etc.

The computing device 1210 may be electronic or optical, for example, and may include an execution unit 1211, a memory 1212, a storage device 1213, an input control 1214, a modem 1215, a network interface 1216, and a display 1217. The execution unit 1211 may control components of the computing device 1210 to provide a graphical modeling environment. The memory 1212 may store instructions or data and may provide them to the execution unit 1211 so that the execution unit 1211 can operate the computing device 1210 and can run a technical computing environment, such as the graphical modeling environment. The storage 1213 may contain software tools for applications. In one implementation, storage 1213 can include code for the operating system (OS) 1220 of the device 1210, code for applications 1221 running on the operating system 1220 including applications 1222 for providing the graphical modeling environment, and data 1223 for the graphical models generated in the graphical modeling environment. In other implementations, the applications can be stored in the memory 1212 or they can be stored on a network device, such as a networked storage device.

Optionally, the computing device 1210 may include single or multiple Central Processing Units (CPUs) 1211a for executing software loaded in the memory 1212, and other programs for controlling system hardware. Each of the CPUs 1211a can include a single core or multiple cores 1211b. The code loaded in the memory 1212 may run in a virtualized environment, such as in a Virtual Machine (VM) 1211c. Multiple VMs 1211c may be resident on a single processor. Also, part of the application could be run in hardware, for example, a graphics processing unit (GPU) 1211d, digital signal processor (DSP) 1211e, a field programmable gate array (FPGA) 1211f or an application specific integrated circuit (ASIC) 1211g.

The input control 1214 may interface with a keyboard 1218, a mouse 1219, and/or other input devices, such as audio, video, neuro and motion-based interfaces. The computing device 1210 may receive through the input control 1214 input data necessary for creating models, such as the selection of the attributes and operations of components in the models. For example, the user may input parameters of components via, for example, dialog boxes of the components in the models. The computing device 1210 may also receive through the input control 1214 input data necessary for controlling the execution of the models. Display 1217 may present user interfaces to allow users to create, edit, simulate, execute, etc., the models. The resources depicted in FIG. 12A may be connected to each other through the bus 1224. The bus 1224 may be an on-chip, off-chip or network bus and/or may include a control-area network bus. The bus 1224 may also include various other implementations, such as Peripheral Component Interconnect (PCI) and PCMCI.

Figure 12B:
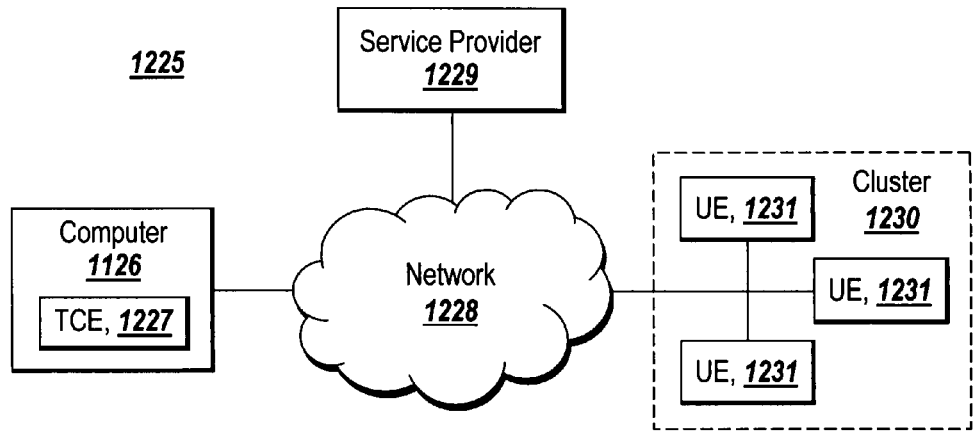
FIG. 12B illustrates an exemplary client-server environment suitable for practicing an exemplary embodiment of the present invention.

FIG. 12B illustrates an exemplary distributed implementation of a system for practicing an exemplary embodiment. System 1225 may include computer 1226, network 1228, service provider 1229, target environment 1230, and cluster 1230. The embodiment of FIG. 12B is exemplary, and other embodiments can include more devices, fewer devices, or devices in arrangements that differ from the arrangement of FIG. 12B. The computer may further include a technical computing environment (TCE) 1227, such as a graphical modeling environment. In certain embodiments, the computer 1226 may be a computing device 1210 as discussed above in regard to FIG. 12A.

Network 1228 may transport data from a source to a destination. Embodiments of network 1228 may use network devices, such as routers, switches, firewalls, and/or servers (not shown) and connections (e.g., links) to transport data. "Data," as used herein, may refer to any type of machine-readable information having substantially any format that may be adapted for use in one or more networks and/or with one or more devices (e.g., computer 1226, service provider 129, etc.). Data may include digital information or analog information. Data may further be packetized and/or non-packetized.

Network 1228 may be a hardwired network using wired conductors and/or optical fibers and/or may be a wireless network using free-space optical, radio frequency (RF), and/or acoustic transmission paths. In one implementation, network 1228 may be a substantially open public network, such as the Internet. In another implementation, network 1228 may be a more restricted network, such as a corporate virtual network. Implementations of networks and/or devices operating on networks described herein are not limited to any particular data type, protocol, architecture/configuration, etc.

Service provider 1229 may include a device that makes a service available to another device. For example, service provider 1229 may include an entity (e.g., an individual, a corporation, an educational institution, a government agency, etc.) that provides one or more services to a destination using a server and/or other devices. Services may include instructions that are executed by a destination to perform an operation. Alternatively, a service may include instructions that are executed on behalf of a destination to perform an operation on the destination's behalf.

Cluster 1230 may include a number of units of execution (UEs) 1231 and may perform processing on behalf of computer 1226 and/or another device, such as service provider 1229. For example, in one embodiment cluster 1230 may perform parallel processing of a model received from computer 1226 and/or TCE 1227. Cluster 1230 may include UEs 1231 that reside on a single device or chip or that reside on a number of devices or chips.

UEs 1231 may include processing devices that perform operations on behalf of a device, such as a requesting device. In certain embodiments, the computer 1226 or service provider 1229 may operate cluster 1230. UEs 1231 may be hardware units of execution or software units of execution.

A "hardware unit of execution," as the term is used herein, is to be broadly interpreted to include a device (e.g., a hardware resource) that performs and/or participates in parallel programming activities. For example, a hardware unit of execution may perform and/or participate in parallel programming activities in response to a request and/or a task it has received (e.g., received directly or via a proxy). A hardware unit of execution may perform and/or participate in substantially any type of parallel programming (e.g., task, data, stream processing, etc.) using one or more devices. For example, in one implementation, a hardware unit of execution may include a single processing device that includes multiple cores and in another implementation, the hardware unit of execution may include a number of processors. A hardware unit of execution may also be a programmable device, such as a field programmable gate array (FPGA), an application specific integrated circuit (ASIC), a digital signal processor (DSP), etc. Devices used in a hardware unit of execution may be arranged in substantially any configuration (or topology), such as a grid, ring, star, etc. A hardware unit of execution may support one or more threads (or processes) when performing processing operations.

A "software unit of execution," as the term is used herein, is to be broadly interpreted to include a software resource (e.g., a soft process) that performs and/or participates in parallel programming activities. For example, a software unit of execution may perform and/or participate in parallel programming activities in response to a receipt of a program and/or one or more portions of the program. A software unit of execution may perform and/or participate in substantially any type of parallel programming using one or more hardware units of execution. Embodiments of a software unit of execution may support one or more threads and/or processes when performing processing operations.

In certain embodiments, the service provider 1229 may control the cluster 1230. For example, a telecommunications provider may operate a web server that provides one or more web-based services to a destination. The web-based services may allow a destination (e.g., a computer operated by a customer) to perform parallel processing using UEs 1231 that are operated by the telecommunications provider. For example, the customer may be allowed to use clusters 1230 to perform parallel processing when the customer subscribes to the offered web service. Service provider 1229 may maintain a database that includes parameters, such as parameters that indicate the status of UEs 1231, clusters 1230, etc. Service provider 1229 may perform a look-up operation in the database when a request for parallel processing is received from the customer. Service provider 1229 may connect the customer to parallel processing resources that are available based on parameters in the database.

In one implementation, the customer may receive services on a subscription basis. A subscription may include substantially any type of arrangement, such as monthly subscription, a per-use fee, a fee based on an amount of information exchanged between the provider and the customer, a fee based on a number of processor cycles used by the customer, a fee based on a number of processors UEs 1231, clusters 1230, etc., used by the customer, etc.

The technical computing environments (TCE) 1227 may include hardware and/or software based logic that provides a computing environment that allows users to perform tasks related to disciplines, such as, but not limited to, mathematics, science, engineering, medicine, business, etc., more efficiently than if the tasks were performed in another type of computing environment, such as an environment that required the user to develop code in a conventional programming language, such as C++, C, Fortran, Pascal, etc.

In one implementation, TCE 1227 may include a dynamically typed language that can be used to express problems and/or solutions in mathematical notations familiar to those of skill in the relevant arts. For example, TCE 1227 may use an array as a basic element, where the array may not require dimensioning. In addition, TCE 1227 may be adapted to perform matrix and/or vector formulations that can be used for data analysis, data visualization, application development, simulation, modeling, algorithm development, etc. These matrix and/or vector formulations may be used in many areas, such as statistics, finance, image processing, signal processing, control design, life sciences, education, discrete event analysis and/or design, state based analysis and/or design, etc.

TCE 1227 may further provide mathematical functions and/or graphical tools (e.g., for creating plots, surfaces, images, volumetric representations, etc.). In one implementation, TCE 1227 may provide these functions and/or tools using toolboxes (e.g., toolboxes for signal processing, image processing, data plotting, parallel processing, optimization, etc.). In another implementation, TCE 1227 may provide these functions as block sets (e.g., an optimization block set). In still another implementation, TCE 1227 may provide these functions in another way, such as via a library, etc. TCE 1227 may be implemented as a text based environment, a graphically based environment, or another type of environment, such as a hybrid environment that is both text and graphically based.

In an embodiment, TCE 1227 may include a graphical modeling environment. Examples of such graphical modeling environment include, but are not limited to, Simulink®, Stateflow®, SimEvents™, etc., by The MathWorks, Inc.; VisSim by Visual Solutions; LabView® by National Instruments; Dymola by Dynasim; SoftWIRE by Measurement Computing; WiT by DALSA Coreco; VEE Pro or SystemVue by Agilent; Vision Program Manager from PPT Vision; Khoros from Khoral Research; Gedae by Gedae, Inc.; Scicos from (INRIA); Virtuoso from Cadence; Rational Rose from IBM; Rhopsody or Tau from IBM; Ptolemy from the University of California at Berkeley; or aspects of a Unified Modeling Language (UML) or SysML environment.

Figure 12C:
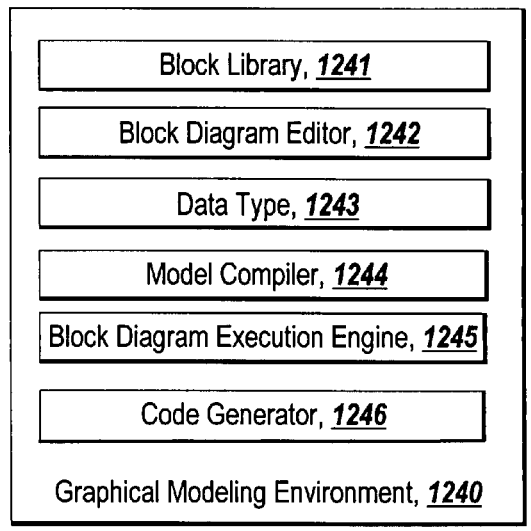
FIG. 12C illustrates an exemplary embodiment of a graphical modeling environment.

FIG. 12C depicts an example of the graphical modeling environment 1240 (hereinafter environment 1240). Environment 1240 may enable users to design a graphical model for a system, simulate the system's behavior, analyze the performance of the system, and refine the design of the system. In the environment 1240, users may build a graphical model, such as a block diagram model, using blocks provided in a block library 1241. The users may be able to customize this block library 1241 to reorganize blocks in a user-defined format, to delete undesired blocks, and/or to add custom blocks users have designed. The blocks may be moved via a human-machine interface, such as the mouse 1219 or keyboard 1218 or other input device, from the block library 1241 onto a window (e.g., model canvas included in an area of a display device).

The environment 1240 may include a block diagram editor 1242 that allows users to perform such actions as draw, edit, annotate, save, print, etc., block diagram representations of systems. The block diagram editor 1242 is a graphical user interface (GUI) component that allows drafting of graphical models by users. In the graphical modeling environment 1240, there may be a textual interface with a set of commands that allow interaction with the block diagram editor 1242. Using this textual interface, users may write scripts that perform automatic editing operations on the graphical model. The environment 1240 may provide a dialog box for enabling users to specify attributes, techniques and/or parameters of each block in the graphical model. Using the dialog box, the users may specify the data types 1243 of block parameters and/or signals generated from the blocks.

Once a graphical model has been constructed within the environment 1240, the model may be executed in the environment 1240. The environment 1240 may include a model compiler 1244 that carries out the task of compiling and linking the graphical model to produce an "in-memory executable" version of the model that is used for generating code and/or simulating a graphical model. The compile stage involves preparing data structures and evaluating parameters, configuring and propagating block characteristics, determining block connectivity, and performing block reduction and block insertion.

The environment 1240 may also include a block diagram execution engine 1245 for executing the "in-memory executable" version of a graphical model or the generated code for the model. In executing a graphical model, the block diagram execution engine 1245 evaluates the state and output of the components in the model. Code may or may not be generated from the model by the code generator 1246. When code is generated, the model may be simulated/executed through an accelerated simulation mode in which the graphical model (or portions of it) are translated into either software modules or hardware descriptions (broadly termed "code"). When code is not generated, the graphical model may execute in an interpretive mode in which the compiled and linked version of the graphical model may be directly utilized to execute the model over the desired time-span. This interpretive mode of execution is suitable for getting fine-grained signal traceability. In other implementations, when users generate code, they may choose to not proceed further with the graphical model's execution. They may choose to take the code and deploy it outside of the confines of the modeling software environment.

In other embodiments, the TCE 1227 may be implemented using one or more text-based products. For example, a text-based TCE 1227, may be implemented using products such as, but not limited to, MATLAB® by The MathWorks, Inc.; Octave; Python; Comsol Script; MATRIXx from National Instruments; Mathematica from Wolfram Research, Inc.; Mathcad from Mathsoft Engineering & Education Inc.; Maple from Maplesoft; Extend from Imagine That Inc.; Scilab from The French Institution for Research in Computer Science and Control (INRIA); Virtuoso from Cadence; or Modelica or Dymola from Dynasim.

Another alternative embodiment may be implemented in a language that is compatible with a product that includes a TCE, such as one or more of the above identified text-based or graphically-based TCE's. For example, MATLAB software (a text-based TCE) may use a first command to represent an array of data and a second command to transpose the array. Another product, that may or may not include a TCE, may be MATLAB-compatible and may be able to use the array command, the array transpose command, or other MATLAB commands. For example, the other product may use the MATLAB commands to perform optimizations on one or more units of execution.

Still other embodiments may be implemented in a hybrid TCE that combines features of a text-based and graphically-based TCE. In one implementation, one TCE may operate on top of the other TCE. For example, a text-based TCE (e.g., MATLAB software) may operate as a foundation and a graphically-based application (e.g., Simulink software) may operate on top of MATLAB software and may take advantage of text-based features (e.g., commands) to provide a user with a graphical user interface and graphical outputs (e.g., graphical displays for data, dashboards, etc.).

Figure 13:
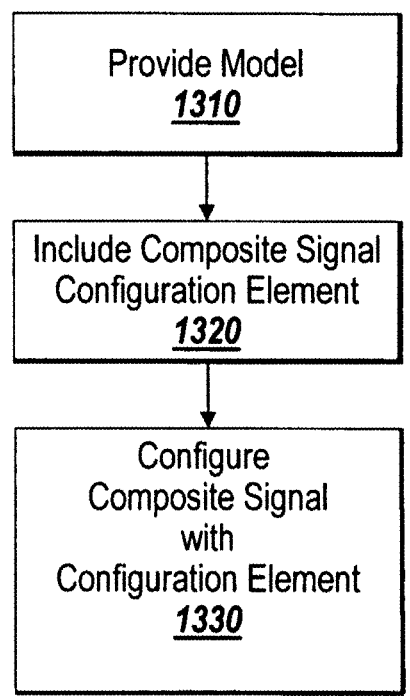
FIG. 13 is a flow chart illustrating a processing that can be used with an exemplary embodiment.

FIG. 13 depicts an exemplary flow diagram representation 1300 of one embodiment of a technique. Here the technique involves providing a model of a system, such as a block diagram, for use in a graphical modeling environment 1240 (step 1310). As part of the model, a composite signal configuration element is provided or included (step 1320). The composite signal configuration element can then be used to configure one or more signals of a composite signal (step 1330). Such a configured composite signal may then be used in the block diagram of the system The model, including the composite signal configuration block, may be provided as code, such as a model file, on a computer readable medium or downloadable from a server. The code may be instructions in a high-level software language such as C, C++, Ada, etc., hardware descriptions of the composite signal configuration element in a language such as HDL, or custom code formats suitable for interpretation in some third-party software. In certain embodiments the model may be part of a library or toolbox for use with the graphical modeling environment.

Figure 14A:
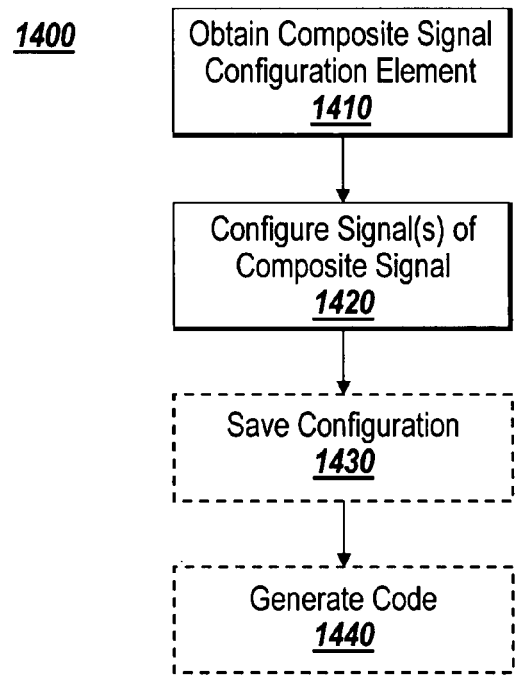
FIG. 14 is a flow chart illustrating exemplary processing that can be used to configure one or more signals of a composite signal.

FIG. 14A depicts a flow diagram 1400 of one embodiment of how a composite signal configuration element may be used in modeling environment, such as a block diagram modeling environment. In this embodiment the process involves obtaining a composite signal configuration block (step 1410) and configuring one or more signals of a composite signal using the composite signal configuration block (step 1420). In certain embodiments the process may further include saving the configuration of the one or more signals (step 1430), to create a template for example, and/or generating code from the composite signal configuration element (step 1440).

Figure 14B:
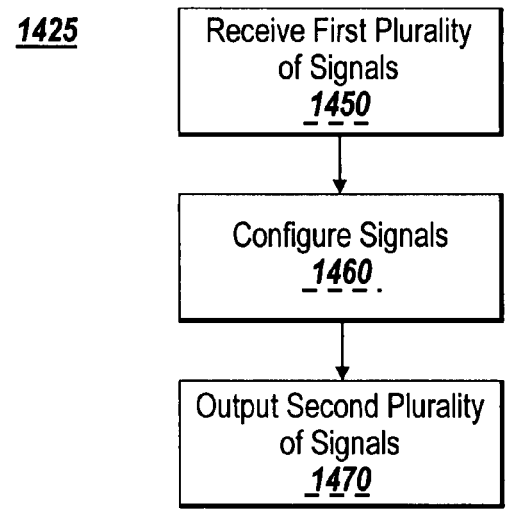

As the composite signal configuration element is for configuring composite signals, either the received or outputted signals may include a composite signal having a selectable grouping. FIG. 14B, depicts a flow diagram 1425 of one embodiment of a methodology of configuring one or more signals of a composite signal such as performed by a composite signal configuration element. In this example, a first group of signals is received (step 1450). One or more of the signals of the first group of signals are configured (step 1460). A second group of signals comprising one or more of the configured signals of the first group may then be output (step 1470).

Regarding the first step (step 1450), the first group of signals may be received as individual signals or composite signals having a selectable grouping of signals, or any combination thereof. Likewise, in outputting the second group (step 1470), the second group may be outputted as individual signals or composite signals or any combination thereof. In some instances there may be multiple composite signals, received or outputted.

The configuring of one or more signals of a composite signal (step 1460) may include manipulating signals to create, edit, or otherwise configure composite signals. This may include selectably combining, bundling, or otherwise grouping one or more of a group of signals to create one or more composite signals as seen above. This may also include separating, unbundling, or otherwise ungrouping one or more composite signals having a selectable grouping of signals into one or more signals. Any combination of selectable grouping and de-grouping, including subsets, may also be combined. In some embodiments, signals may also be added to or omitted from the one or more composite signal.

In some embodiments, code may be generated from the composite signal configuration element or block diagrams incorporating a composite signal configuration element (step 1440). The code may include a cast operator. A cast is an operator supported in several programming languages including C, C++, and JAVA. A cast provides a method for explicit conversion of the type of an object in a specific situation. Casts can be used to convert objects of any scalar type to or from any other scalar type.

The code may be instructions in a high-level software language such as C, C++, Ada, etc., hardware descriptions of the composite signal configuration element in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments or just-in-time code (instructions) that corresponds to sections of the composite signal configuration element for accelerated performance.

In certain embodiments, the template nature of the composite signal configuration element may be preserved by defining actual template classes. For example, some software languages, such as C++, support definition of template classes. In other embodiments, for example, wherein a software language may not support template classes, the template values are resolved and the specific resolved value is included in the generated code. Also, the structure of a composite signal and the mapping between composites and signals could be inferred from C/C++ code.

The examples to this point have focused primarily on the system where the graphical modeling environment was on a local computing device. The graphical modeling environment may of course also be implemented on a network 1225, as illustrated in FIG. 12B.

In one such embodiment a system for generating and displaying a graphical modeling application, comprises a distribution server for providing a composite signal configuration element for a block diagram model, and a client device in communication with the distribution server. Here the distribution server provides a client device, such as a computing device discussed above, with a composite signal configuration element.

In another embodiment, the server may execute the graphical modeling environment. A user may then interact with the graphical modeling interface on the server through the client device. In one example of such a system, a server and client device are provided. The server is capable of executing a graphical modeling environment, wherein the graphical modeling environment provides a block diagram model of a dynamic system. The client device is in communication with the server over a network. A composite signal configuration element diagram, for configuring one or more signals of a composite signal, is selected at the server from the client device.

It will be understood by one skilled in the art that these network embodiments are exemplary and that the functionality may be divided up in any number of ways over a network.

While the examples set forth above are directed primarily to blocks for use in a graphical modeling environment. It will be understood that the techniques and methodology set forth herein is not limited to block or graphical modeling environments. The functionality disclosed herein may be implemented in functions, textual based modeling, or code (e.g., programming language code). Other possible implementations will be apparent to one skilled in the art given the benefit of this disclosure.

The embodiments herein may provide a graphical modeling environment for modeling a system that simplified creation, editing, and conversion of composite signals to make the handling of multiple data signals more effective, intuitive and easy to use. The use of composite signal configuration elements provides simplified block diagrams and facilitates data entry to make simulation of a dynamic system more efficient. In addition, the use of the disclosed composite signal configuration element and methodology results in significant saving in resource utilization as the number of elements needed to be implemented and executed is reduced. This in turn provides an increase in performance in execution.

The methodology and examples have been described relative to an illustrative embodiment. Since certain changes may be made in the above constructions without departing from the scope of this disclosure, it is intended that all matter contained in the above description or shown in the accompanying drawings be interpreted as illustrative and not in a limiting sense.

It is also to be understood that the following claims are to cover all generic and specific features of the methods and apparatus described herein, and all statements of the scope, as a matter of language, might be said to fall therebetween.

The invention claimed is:

1. A non-transitory medium holding instructions that, when executed by a computing device, cause the computing device to:
    obtain a composite signal configuration element used in a model;
    receive, at the composite signal configuration element, a plurality of individual signals;
    arrange the plurality of individual signals into a composite signal using the composite signal configuration element;
    configure, using the composite signal configuration element, one or more of the plurality of individual signals, the configuring:
        resulting in one or more configured signals,
        manipulating a structure or arrangement of the one or more of the plurality of signals in the composite signal, and
        occurring without decomposing the composite signal into constituent signals in the model;
    output, from the composite signal configuration element, at least one of the one or more configured signals; and
    display, store, or transfer the at least one of the configured signals.

2. The medium of claim 1, wherein the at least one of the one or more configured signals is output as part of the composite signal, and the composite signal comprises a selectable grouping of the one or more configured signals.

3. The medium of claim 2, wherein the composite signal comprises an instance of an object class.

4. The medium of claim 2, wherein the one or more instructions for configuring the one or more of the plurality of individual signals comprise:
    one or more instructions for selectably grouping the one or more of the plurality of individual signals into a hierarchy; or
    one or more instructions for selectably concatenating the one or more of the plurality of individual signals.

5. The medium of claim 1, wherein at least one of the one or more configured signals is output as part of a second plurality of individual signals.

6. The medium of claim 1, wherein the one or more instructions for configuring the one or more of the plurality of individual signals comprise:
    one or more instructions for specifying attributes or data types for the one or more of the plurality of individual signals.

7. The medium of claim 1, wherein the composite signal configuration element further comprises functionality for performing an operation on one or more of the plurality of individual signals.

8. The medium of claim 1 further holding:
    one or more instructions for storing a configuration of the composite signal configuration element as a template.

9. A non-transitory medium holding instructions that, when executed by a computing device, cause the computing device to:
    obtain a composite signal configuration element used in a model;
    receive, at the composite signal configuration element, a plurality of signals;
    arrange a selectable subset of the plurality of signals into a composite signal;
    configure, using the composite signal configuration element, one or more of the plurality of signals to create one or more configured signals, the configuring comprising displaying a dialog on a display, the dialog for:
        arranging the plurality of signals into a hierarchy in the composite signal, or
        concatenating the plurality of signals in the composite signal,
        wherein the configuring occurs without decomposing the composite signal into constituent signals in the model;
    output, from the composite signal configuration element, the composite signal; and
    display, storing, or transferring the composite signal.

10. The medium of claim 9, wherein the composite signal is output as part of a second plurality of signals comprising one or more of the configured signals.

11. The medium of claim 10, wherein the second plurality of signals includes individual signals as well as a second composite signal.

12. The medium of claim 9, wherein the plurality of signals comprises an input composite signal.

13. The medium of claim 9, wherein the composite signal configuration element further performs an operation on one or more of the selectable subset of the plurality of signals in the composite signal.

14. The medium of claim 9, wherein the configuring of the one or more of the plurality of signals is user specified.

15. The medium of claim 9, further holding:
    one or more instructions for storing a configuration of the composite signal configuration element as a template.

16. The medium of claim 9, wherein the one or more instructions for configuring one or more of the plurality of signals comprise:
    one or more instructions for separating out one or more individual signals from the plurality of signals, wherein the one or more individual signals are outputted in a second plurality of signals separate from the outputted composite signal.

17. A non-transitory medium holding instructions that, when executed by a computing device, cause the computing device to:
    obtain a composite signal configuration element for configuring one or more signals of a composite signal in a model;

configure the one or more signals of the composite signal using the composite signal configuration element, wherein the configuring the one or more signals comprises displaying an interface element on a display, the interface element including a dialog for:
- selectably grouping the one or more signals into a hierarchy, or
- selectably concatenating the one or more signals,
- wherein the configuring occurs without decomposing the composite signal into constituent signals in the model; and generate code from the configuration of the one or more signals, wherein the generated code comprises a cast operator.

18. The medium of claim 17, wherein the composite signal comprises a selectable grouping of the one or more signals.

19. A computing device for generating and displaying a graphical modeling application, comprising:
- memory storing computer program instructions and data; and
- a processor for executing the stored computer program instructions, the stored computer program instructions comprising instructions that, when executed by the processor, cause to processor to:
  - arrange one or more individual signals into a composite signal in a graphical model,
  - use a composite signal configuration element to configure the one or more individual signals of the composite signal, the configuring of the one or more individual signals:
    - resulting in one or more configured signals,
    - manipulating a structure or arrangement of the one or more signals in the composite signal, and
    - occurring without decomposing the composite signal into constituent signals in the graphical model,
  - output from the composite signal configuration element at least one of the one or more configured signals, and
  - display, store, or transfer the at least one configured signal.

20. The computing device of claim 19, wherein the processor generates code including a cast operation.

21. The computing device of claim 19, wherein at least one of the one or more configured signals is output as part of the composite signal, the composite signal comprising a selectable grouping of the one or more of the configured signals.

22. A computing device for generating and displaying a graphical modeling application, comprising:
- memory storing computer program instructions and data; and
- a processor for executing the stored computer program instructions, the stored computer program instructions comprising instructions that, when executed by the processor, cause the processor to:
  - arrange a plurality of signals into a composite signal comprising a selectable subset of the plurality of signals in a graphical model,
  - configure one or more of the plurality of signals using a composite signal configuration element, the configuring comprising displaying an interface element on the display device, the interface element including a dialog for:
    - arranging the one or more of the plurality of signals into a hierarchy in the composite signal, or
    - concatenating the one or more of the plurality of signals in the composite signal,
    - wherein the configuring occurs without decomposing the composite signal into constituent signals in the model,
  - output, from the composite signal configuration element, the composite signal, the composite signal including one or more configured signals, and
  - display, store, or transfer the composite signal.

23. The computing device of claim 22, wherein the processor generates code including a cast operation.

24. The computing device of claim 22, wherein the processor separates out one or more individual signals from the plurality of signals and outputs the individual signals separately from the composite signal.

* * * * *

UNITED STATES PATENT AND TRADEMARK OFFICE
CERTIFICATE OF CORRECTION

| | | |
|---|---|---|
| PATENT NO. | : 8,635,055 B1 | Page 1 of 1 |
| APPLICATION NO. | : 11/975078 | |
| DATED | : January 21, 2014 | |
| INVENTOR(S) | : Claudia Wey et al. | |

It is certified that error appears in the above-identified patent and that said Letters Patent is hereby corrected as shown below:

Title Page, at (75) Inventors, line 2, replace "Balasubramanin" with --Balasubramanian--

Title Page, at (73) Assignee, replace "The Math Works, Inc." with --The MathWorks, Inc.-- (delete the space between "Math" and "Works")

Signed and Sealed this
Twenty-ninth Day of July, 2014

Michelle K. Lee
*Deputy Director of the United States Patent and Trademark Office*